(12) United States Patent
Yap et al.

(10) Patent No.: US 7,772,881 B1
(45) Date of Patent: Aug. 10, 2010

(54) METHOD AND APPARATUS FOR IN-SYSTEM PROGRAMMABILITY

(75) Inventors: Chee Wai Yap, Penang (MY); Joseph DeLaere, Los Gatos, CA (US); Mark Webb, Austin, TX (US)

(73) Assignee: Altera Corporation, San Jose, CA (US)

( * ) Notice: Subject to any disclaimer, the term of this patent is extended or adjusted under 35 U.S.C. 154(b) by 454 days.

(21) Appl. No.: 11/537,519

(22) Filed: Sep. 29, 2006

(51) Int. Cl.
*H01L 25/00* (2006.01)

(52) U.S. Cl. .............................. 326/41; 326/47; 712/15; 711/170

(58) Field of Classification Search ............. 326/37–41, 326/47; 711/170, E12.084; 712/15
See application file for complete search history.

(56) References Cited

U.S. PATENT DOCUMENTS

| | | | | |
|---|---|---|---|---|
| 5,473,758 A | * | 12/1995 | Allen et al. | 711/103 |
| 5,859,544 A | * | 1/1999 | Norman | 326/40 |
| 6,031,391 A | * | 2/2000 | Couts-Martin et al. | 326/38 |
| 6,191,614 B1 | * | 2/2001 | Schultz et al. | 326/41 |
| 6,233,177 B1 | * | 5/2001 | Shokouhi et al. | 365/185.23 |
| 6,414,871 B1 | * | 7/2002 | Wirtz et al. | 365/185.01 |
| 6,459,297 B1 | * | 10/2002 | Smiley | 326/38 |
| 6,573,748 B1 | * | 6/2003 | Trimberger | 326/38 |
| 6,625,796 B1 | * | 9/2003 | Rangasayee et al. | 716/17 |
| 6,651,199 B1 | * | 11/2003 | Shokouhi | 714/727 |
| 7,134,025 B1 | * | 11/2006 | Trimberger | 713/189 |
| 7,190,190 B1 | * | 3/2007 | Camarota et al. | 326/38 |
| 7,200,235 B1 | * | 4/2007 | Trimberger | 380/277 |
| 2005/0242834 A1 | * | 11/2005 | Vadi et al. | 326/37 |

\* cited by examiner

*Primary Examiner*—James H. Cho
*Assistant Examiner*—Jason Crawford
(74) *Attorney, Agent, or Firm*—Martine Penilla & Gencarella, LLP

(57) ABSTRACT

A PLD having real-time in-system programmability (ISP) capability is provided. The PLD includes a configuration memory region into which the updated configuration is obtained. A user memory region stores the state for registers of the PLD. The configuration memory region communicates the updated configuration to a core logic region that includes a real-time ISP detection block that detects the initiation of a real-time ISP operation. A controller is in communication with the logic block. The PLD maintains register data by reading a state of the registers of the PLD/logic block and clamping the output pins before the core logic region is being updated. The state of the registers is saved in the memory region as directed by the controller. Upon completion of the update into the logic array, the registers of the PLD are cleared and a control signal from a memory interface triggers the controller to read stored the register data back from the memory and reload the registers. Upon the completion of reloading the registers, the output pins are released for normal device operation.

20 Claims, 6 Drawing Sheets

METHOD AND APPARATUS FOR IN-SYSTEM PROGRAMMABILITY

BACKGROUND

As time-to-market pressure increases, design engineers require advanced system-level products to ensure problem-free development and manufacturing. Programmable logic devices (PLDs) with in-system programmability (ISP) can help accelerate development time, facilitate in-field upgrades, simplify the manufacturing flow, lower inventory costs, and improve printed circuit board (PCB) testing capabilities.

Real-time ISP reduces maintenance costs by allowing users to program a device while the device is in operation. This feature enables quick in-field product updates without requiring the system to be turned off to initiate reconfiguration. Other than having the device going through a power cycle, the other method that forces the flash to SRAM download process to occur after the real-time ISP clears all registers in the device of any previously stored values and by default tri-states the I/O pins during the process. Thus, if it is desired to continue the new configuration with the previous register data, there is no technique currently available that would not interrupt the system.

As a result, there is a need to solve the problems of the prior art to provide a PLD capable of utilizing real-time in-system programmability in a manner that retains register data so that the system operation is not interrupted or otherwise impacted.

SUMMARY

Broadly speaking, the present invention fills these needs by providing a programmable logic device in which in-system programmability may be applied without causing unavailability of the system resources. It should be appreciated that the present invention can be implemented in numerous ways, including as a method, a system, or an apparatus. Several inventive embodiments of the present invention are described below.

In one aspect of the invention, a programmable logic device (PLD) having real-time in-system programmability (ISP) capability for updating a logic block or blocks of the PLD is provided. The PLD includes a flash memory region into which the updated configuration is initially obtained. A portion of the flash memory region is utilized as a user flash memory region that stores a state for the corresponding output pins of the PLD or logic block in one embodiment. The flash memory region communicates the updated configuration to a core logic region of the PLD through interface logic. The core logic region also includes a real-time ISP detection block that will detect the initiation of real-time in-system programmability operation. A controller in communication with the interface logic and the logic block is included in the core logic. Assuming the output pins are connected directly to the registers of the logic block, the PLD functions as normal and maintains register data by reading a state of the output pins of the PLD/logic block and clamping the output pins to this state in response to the transition of a trigger signal. The state of the output pins, which may be referred to as the register data, is saved in the user flash memory region as directed by the controller. Upon completion of the update into the logic array from the flash memory, an internally generated signal triggers the controller to read the register data from the user flash memory. In one embodiment, another set of input pins are used to capture the clamped states of the logic blocks output pins. Since the input pins are released earlier than the output pins after the SRAM download, the input pins may be used to capture the output pin values to reload the registers prior to releasing the output pins. In another embodiment, the state of the output pins is preset based on the trigger signal from the interface block between the user flash memory and the logic.

In another aspect of the invention, a method for in-system programmability (ISP) of a programmable logic device is provided. A current state of the I/O pins of a logic block of the PLD is captured and stored in response to a trigger signal indicating that a configuration of the PLD is being updated. The updated configuration is downloaded to the SRAM portion of the PLD and in response to the completion of this download, the registers of the logic block is reloaded from the stored data. Thereafter, the PLD/logic block resumes operation under the updated configuration without incurring a power reset or any interruption in the operation of the PLD or any system associated with the PLD. All the methods mentioned works in the condition that the necessary logic blocks are included in the initial design in the device and the updated design that replaces the initial design in the SRAM upon the completion of the SRAM download process.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1A:
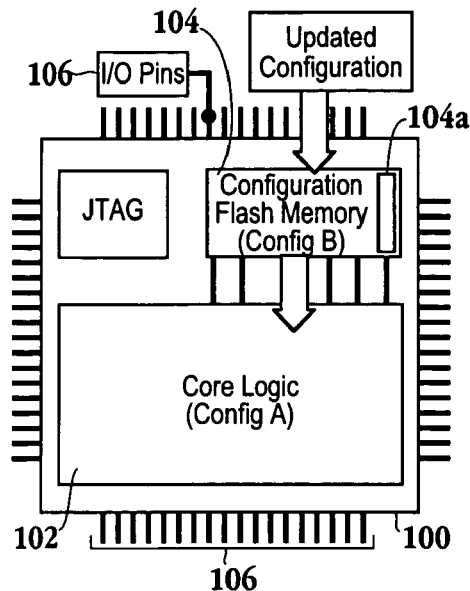
FIGS. 1A through 1D provide a high-level exemplary process of updating a programmable logic device in accordance with one embodiment of the invention.

A method and apparatus enabling real-time in-system programmability is provided. It will be obvious, however, to one skilled in the art, that the present invention may be practiced without some or all of these specific details. In other instances, well known process operations have not been described in detail in order not to unnecessarily obscure the present invention.

In-system programmability (ISP) is a feature desired for many computing systems, e.g., web servers and other systems requiring periodic updates. However, one of the drawbacks with current designs is that the real-time in-system programmability does not provide for a technique to capture register data of the PLD in the event of SRAM download in order for the new design to function. Within these systems, complex programmable logic devices (CPLD) are being increasingly utilized. However, the updates to these logic devices will need to be performed in a manner so that system up-time requirements are met for the systems that are served by the logic devices and the register data is maintained. The embodiments described herein enable the performance of real-time in-field updates to a CPLD device without affecting system up-time operation.

The embodiments described below will replace an existing design configuration with a new design configuration when there is either a power cycle to the device (powering down and powering up again) or with the execution of certain in-system programmability instructions to commence the static random access memory (SRAM) download process when the real-time ISP has completed. In one embodiment, the flash to SRAM download process clears all device registers of any previously stored values and by default tri-states the I/O pins during the process. In order to force an SRAM download without a power cycle, the device is placed in a programming mode (either ISP or ISP Clamp mode), and then exits the programming mode and returns to a user mode. The SRAM download starts when the device exits the (non-real-time ISP) programming mode. In one embodiment, a real-time ISP update is loaded into the SRAM after the Joint Test Action Group (JTAG) commands execute the instructions for the ISP or the ISP Clamp entry and exit. As will be described below, the JTAG interface is used to shift in the appropriate instructions to bring the device into programming mode or back to user mode. It should be appreciated that using the JTAG interface also allows control of the test access port (TAP) controller state machine within the device. The JTAG interface utilizes JTAG pins for communication with the device being updated. One skilled in the art will appreciate that the embodiments described herein may support JTAG boundary scan circuitry that complies with IEEE Std. 1149.1-2001 specification In one embodiment, the SRAM download is forced through a special set of Jam standard test and programming language (STAPL) commands that execute the short instruction sequence needed. The Jam file contains the ISP and JTAG instructions that are shifted into the device to force the device into certain modes: user mode, ISP Clamp mode, or real-time ISP mode. This file also controls the TAP controller state machine. A Jam file is an ASCII file that stores programming data and instructions for programming, verifying, and blank-checking one or more ISP-capable devices in a JTAG chain.

Table 1 describes the ISP and JTAG instructions in the Jam file. While the details of the Jam file are provided herein, the embodiments are not restricted to this configuration as any file format and signal configuration that accomplishes the functionality described herein for the seamless update of a configuration may be incorporated with the embodiments described herein. In addition, it should be further appreciated that the counter design example provided above is also an exemplary embodiment and the invention is not limited by this example. That is, the configuration update may be provided for any programmable logic device controlling any functionality within a system that must be maintained in an up-state during the configuration update. One skilled in the art will appreciate that the Jam STAPL is an exemplary file type in that the functionality described herein is not restricted to this file type as any suitable format may be used that accomplishes the functionality described herein.

TABLE 1

| Instruction Name | Instruction Code | Description |
| --- | --- | --- |
| SAMPLE_PRELOAD | 00 0000 0101 | Captures the current state of the I/O pins so that the device can clamp the pins to their respective states when it enters ISP Clamp mode. |
| ISP_ENABLE_CLAMP | 10 0011 0011 | Forces the device to enter ISP Clamp mode. |
| ISP_DISABLE | 10 0000 0001 | Forces the device to exit ISP or ISP Clamp to start the SRAM download. |
| RT_ISP_ENABLE | 01 1001 1001 | Forces the device to enter real-time ISP mode and asserts the UFM real-time ISP busy (rtpbusy) signal as a trigger signal to store the register data in the UFM. This signal also acts as the indicator for the design to reload the data into the registers. |
| RT_ISP_DISABLE | 01 0110 0110 | Forces the device back to user mode from real-time ISP mode. |

The Jam file contains the ISP/JTAG instructions and controls the TAP controller state machine. In one embodiment, a programming tool reads the instructions in the Jam file and outputs the vectors to the JTAG pins of the device to tell the device what to do.

Figure 1B:
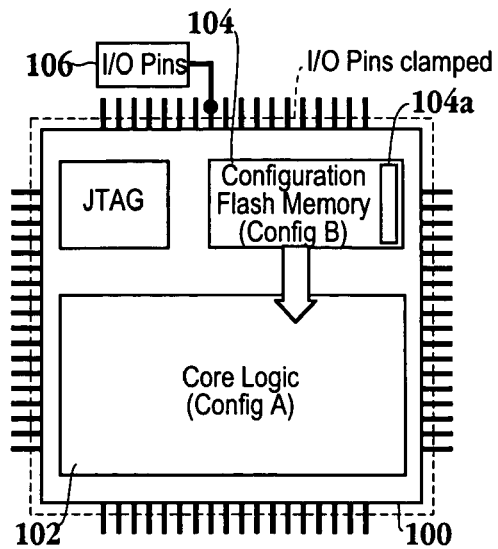
Figure 1C:
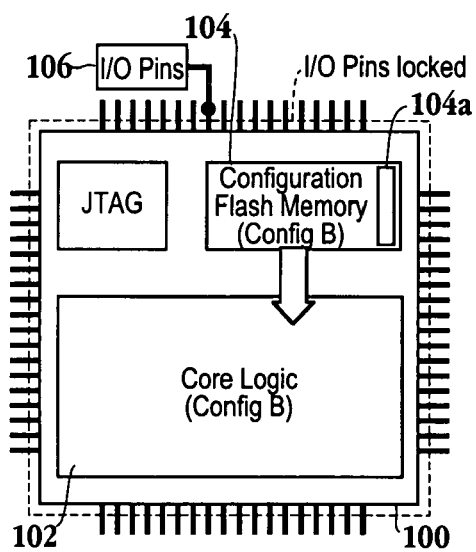
Figure 1D:
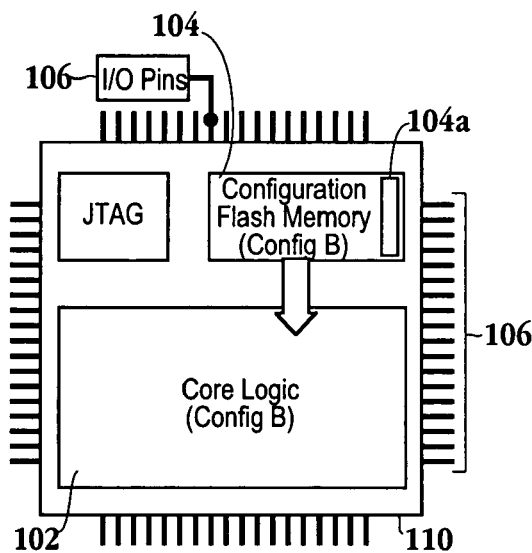

FIGS. 1A through 1D provide a high-level exemplary process of updating a programmable logic device in accordance with one embodiment of the invention. In FIG. 1A, a configuration, i.e., configuration 2, is being downloaded into flash memory region 104 of programmable logic device 100. As can be seen, pins 106 provide input and output capability into programmable logic device 100. Flash memory region 104 is in communication with the logic fabric having a static random access memory (SRAM) region in which an initial configuration, i.e., configuration 1, is stored. In FIG. 1B, the I/O pins are locked or clamped. It should be appreciated that prior to locking the I/O pins 106 they are sampled and the values are stored within flash memory portion 104a in one embodiment. In another embodiment, a signal that notes the flash update is happening is received and a snapshot, i.e., of the current state, of the registers is captured. It should be appreciated that these registers feed the corresponding pins of the PLD and these values are stored into flash portion 104a, which may be referred to as user flash memory and is a separate memory region from the flash memory region in one embodiment. In FIG. 1C the new configuration, i.e., configuration 2, is downloaded to the SRAM of the logic fabric 102. Here, pins 106 are locked or clamped while the configuration data transfer from flash memory 104 to the SRAM of the logic fabric 102 takes place. Upon the completion of SRAM download, the registers are cleared. In FIG. 1D the logic block, e.g., a separate counter, determines that the registers are cleared. If the registers are cleared (which means either power cycle or SRAM download occurred), the logic block will check the signal from the real-time ISP detection block. If the signal indicates the SRAM download has occurred, the registers will be reloaded with data from the UFM. If the signal indicates a power-up has occurred, then the registers are loaded with zeros, which should be the default value for all the registers in the device upon power-up.

Within the embodiments described herein, three possibilities exist for performing the configuration updates. In one embodiment, the flash memory portion 104a described with regard to FIGS. 1A through 1D is updated with the corresponding setting for the pins so that a seamless transition may take place, in terms of not losing the register data and the output pins will not toggle during the process, i.e., the process is glitchless. In another embodiment, the flash memory portion 104a, also referred to as user flash memory (UFM) is not utilized as the configuration for the pins is known and can be accessed elsewhere. For example, a non-volatile memory off-chip of the PLD may contain the configuration of the pins and this configuration can be triggered to be downloaded to the registers of the logic block being updated as required. In yet another embodiment, the I/O pins are used to store the data. Here, the output pins of the PLD are locked and the values are then used as input to the input pins upon completion of the configuration update to the PLD. It should be appreciated that any of the above-described embodiments may accomplish the seamless transition for the update of a programmable logic device without affecting system up-time.

Figure 2:
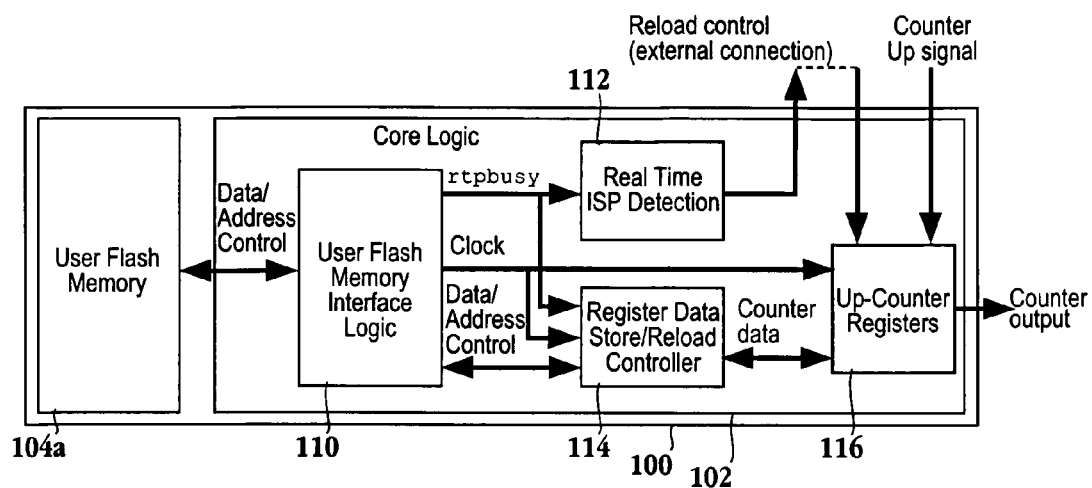
FIG. 2 is a simplified schematic diagram illustrating the blocks for a programmable logic device capable of being updated with real-time in-system programmability while maintaining register data in accordance with one embodiment of the invention.

FIG. 2 is a simplified schematic diagram illustrating the blocks for a programmable logic device capable of being updated with real-time in-system programmability while maintaining register data in accordance with one embodiment of the invention. Programmable logic device 100 includes UFM 104a and core logic 102. UFM 104a is in communication with core logic 102 through user flash memory interface logic 110. The rtpbusy signal is used to indicate that a real-time ISP is in progress and this signal will be detected by real-time ISP detection block 112 to trigger subsequent events, i.e., whether up-count registers 116 load stored data from UFM 104a or all zeros. Register data store/re-load controller 114 and up-counter registers 116 are included within core logic 102. Register data store/re-load controller 114 handles all interface operations with UFM 104a for the read, write, and erase operations. Once Register data store/re-load controller 114 detects the rtpbusy signal, which will go high upon the execution of the RT_ISP_ENABLE instruction, the controller captures the data from up-counter registers 116 and stores the data in UFM 104a before the SRAM download operation starts. The up-counter used herein is an example piece of synchronous logic whose register values are captured and restored. It should be appreciated that the embodiments are not limited to an up-counter as any logic block that stores/accesses register data that may be impacted when a real-time ISP is executed may be take advantage of the embodiments described herein. Register data store/re-load controller 114 automatically retrieves the data back from UFM 104a for the up counter after the SRAM download.

Figure 3:
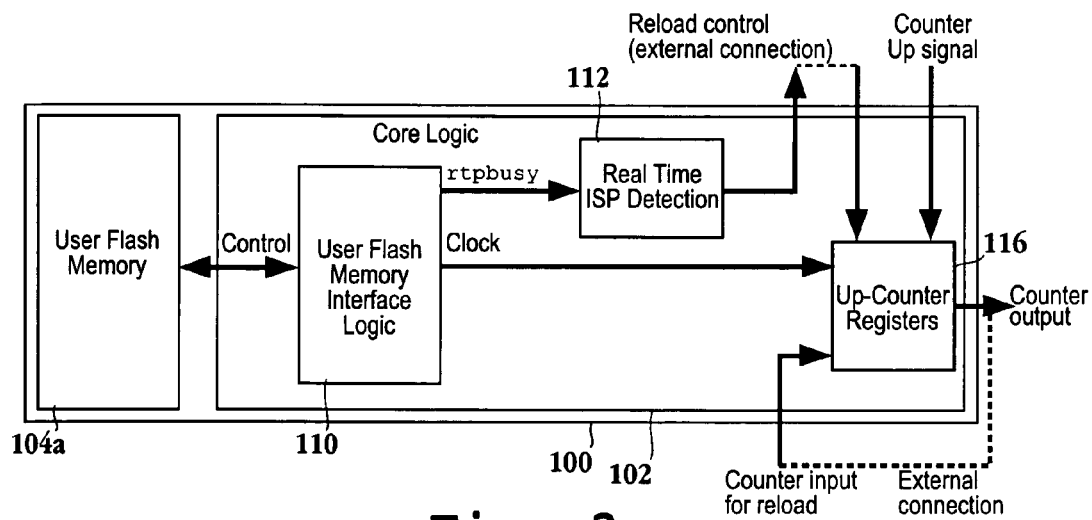
FIG. 3 is a simplified schematic diagram illustrating the core blocks for an alternative embodiment to the design of FIG. 2.
Figure 4:
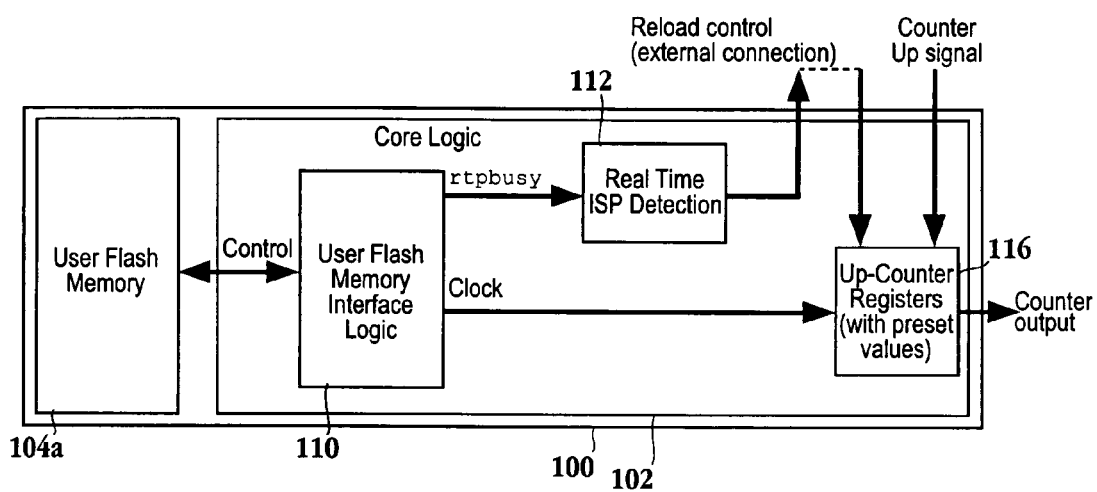
FIG. 4 is yet another alternative embodiment of the configuration for providing a seamless in-system programmability update as described with regard to FIG. 2.

FIGS. 2-4 include an exemplary 4-bit up-counter to show how the SRAM download process can work without interrupting the function of the counter or without losing data. In other designs there may be registers that require data retention during the SRAM download process. By default, the up counter powers up to all 0's. The counter value increments by one with every rising edge to the count up port. In one embodiment, the rtp input pin of the up-counter connects to the output pin of a D flip-flop of the core logic region, which act as the real-time ISP detection block, externally off-chip. The output pin of the D flip-flop indicates when the counter should load the data from the UFM. Further information on this exemplary design is provided on the assignee's website at http://www.altera.com/literature/an/an410.pdf, which is incorporated herein by reference.

FIG. 3 is a simplified schematic diagram illustrating the core blocks for an alternative embodiment to the design of FIG. 2. FIG. 3 illustrates programmable logic device 100 having core logic 102 and user flash memory 104a. As illustrated, user flash memory interface logic 110 and real-time ISP detection block 112 are included along with up-counter registers 116. Instead of using UFM 104a to store the register data, the ISP Clamp feature is used to retain the register data. The user design in the logic array and input pins start to function as soon as the device exits the ISP Clamp mode. However, the device still clamps the output pins until the TAP controller state machine reaches the reset state. This allows a user to drive clamped output pins back into the device input pins. In essence, the clamped output pins are used as storage for register data that drove those output pins. It should be appreciated that this design does not use the controller module of FIG. 2 because this design does not require writing to or reading from the UFM 104a, and therefore consumes less logic element resources. In FIG. 3, ISP detection block will determine whether up-count registers 116 load stored data from the clamped output pins or all zeros.

FIG. 4 is yet another alternative embodiment of the configuration for providing a seamless real-time in-system programmability update as described with regard to FIG. 2. Within FIG. 4, user flash memory 104a and core logic 102 are in communication through user flash memory interface logic 110. Real-time ISP detection block 112 and up-counter registers 116 having pre-set values are also included within core logic 102. In this embodiment, the configuration for the output pins is pre-set within the counter registers as the configuration as known. Thus, there is no need to store the snapshot of the pins in user flash memory 104a. The design shown in FIG. 4 loads the registers with the preset values each time after an SRAM download occurs as detected by ISP detection block 112. It will be apparent to one skilled in the art that this design needs only minimal modification to the counter module for implementation.

It should be appreciated that the Reload control (external connection) depicted in FIGS. 2-4 allows the up-counter to differentiate whether a power cycle or SRAM download has been completed, as all registers in the device are cleared under both of these conditions. The reload control originates from the ISP detection block, and this control signal will cleared during power-up, but not in the event of SRAM download after the real-time TSP. If the reload control signal is high and all the registers are cleared, the up-counter will reload the registers with data from the UFM (as discussed with reference to FIG. 2), the clamped pins (as discussed with reference to FIG. 3), or from the preset values (as discussed with reference to FIG. 4). If this reload control signal is low and all the registers are cleared, the up-counter will reload its registers with zeros because it's a power up.

Figure 5:
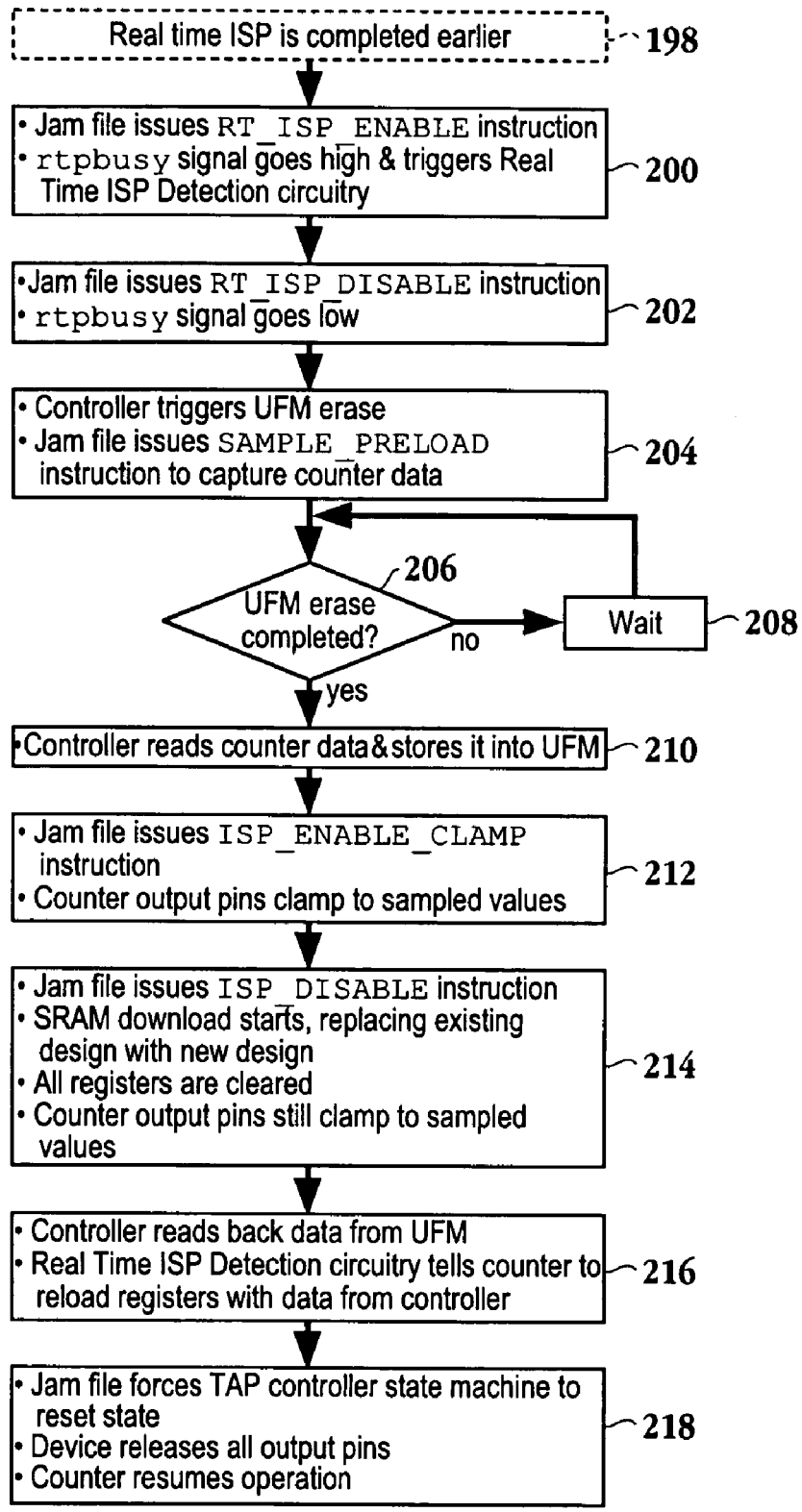
FIG. 5 is a flow chart diagram illustrating the method operations for updating a configuration for the embodiment of FIG. 2 through in-system programmability using the user flash memory in accordance with one embodiment of the invention.

FIG. 5 is a flow chart diagram illustrating the method operations for updating a configuration for the embodiment of FIG. 2 through in-system programmability using the user flash memory in accordance with one embodiment of the invention. The method initiates with operation 198 where a real-time ISP is completed, i.e., the flash memory is programmed with new data/design/configuration. It should be appreciated that the SRAM download does not have to immediately follow the real-time ISP. In operation 200, a Jam file issues the enable instructions (RT_ISP_ENABLE) for the real-time ISP. It should be appreciated that the rtpbusy signal will transition, e.g., go high and trigger the register data store/reload controller 114 to prepare for capturing the up-counter register data to be written into the UFM later on. This signal also triggers the real-time ISP detection circuitry so that the data from the UFM can be reloaded back into the up-counter registers when the SRAM download is completed later on. Thus, the rtpbusy signal functions as a trigger signal. The rtpbusy signal is issued by the UFM interface logic, when the RT_ISP_ENABLE instruction is executed, i.e., shifted into the device. The method then advances to operation 202 where the Jam file issues the disable instruction (RT_ISP_DISABLE) and the rtpbusy signal transitions to a low state. In operation 204 the register data store/reload controller triggers the UFM erase to clear the UFM. In addition, the Jam file issues a SAMPLE_PRELOAD instruction to capture the up-counter output pins' data, which represents the up-counter's register data. The method then advances to operation 206 where it is determined if the UFM erase has been completed. If the UFM erase has not been completed, the method advances to operation 208 where a wait period is enforced and then the method returns to operation 206 and repeats as described above. If the UFM has been completely erased, then the method advances to operation 210 where the register data store/reload controller reads the counter data and stores the data into the UFM.

Advancing to operation 212 of FIG. 5, the Jam file issues the ISP_ENABLE_CLAMP instruction. This instruction results in the counter output pins being clamped to sampled values. In operation 214, the Jam file issues an ISP_DISABLE instruction. This instruction triggers the SRAM download and begins the replacement of an existing design configuration with a new design configuration. In addition, all registers are cleared while the counter output pins are still clamped to sample values. The method then proceeds to operation 216 where the core logic becomes operational and the register data store/reload controller reads back the data from the UFM. At this time, the real-time ISP detection circuitry communicates to the counter to reload registers with data from the newly updated controller. The method then advances to operation 218 where the Jam file forces the TAP controller state machine to reset state. As a result, the device releases all output pins and the operation resumes with the new configuration without any interruption or power reset being forced and with the register data being maintained.

Figure 6:
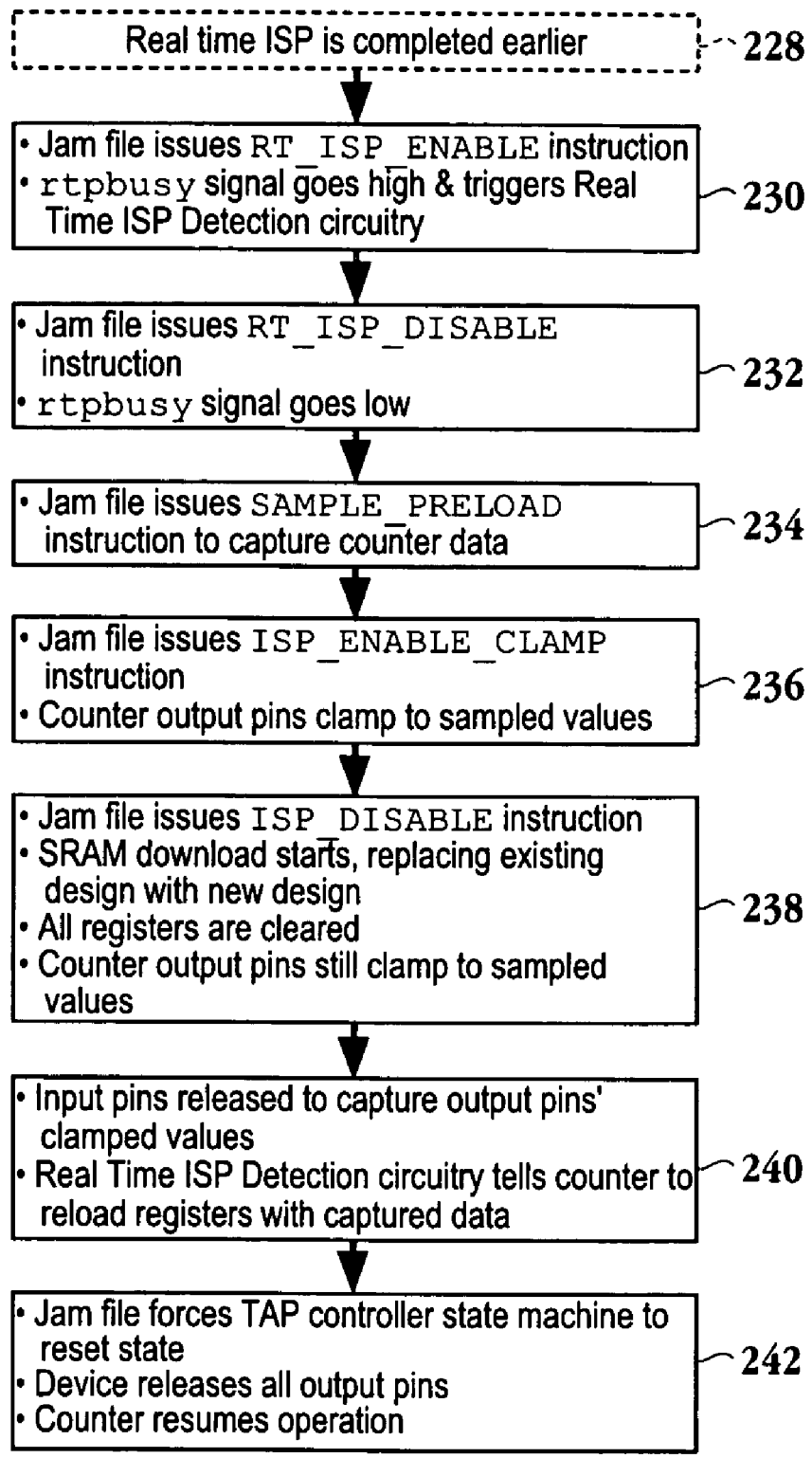
FIG. 6 is a flow chart diagram illustrating the method operations for updating a configuration using I/O pins to store the data for the embodiment of FIG. 3 in accordance with one embodiment of the invention.

FIG. 6 is a flow chart diagram illustrating the method operations for updating a configuration using I/O pins to store the data for the embodiment of FIG. 3 in accordance with one embodiment of the invention. It should be appreciated that in this embodiment, the I/O pins, i.e., the output pins, are used to store the data rather than using the UFM. It should be appreciated that with regard to FIG. 6, the output pins are clamped to the register values if registers are driving those pins. Thus, the pins are actually used to store the register values. The method initiations with operation 228 where a real-time ISP is completed. The method then moves to operation 230 where the Jam file issues the RT_ISP_ENABLE instruction. As a result, the rtpbusy signal goes high and this transition is detected by the real-time ISP detection circuitry. The Jam file then issues the RT_ISP_DISABLE instruction which results in the rtpbusy signal transitioning to a low state in operation 232. In operation 234, the Jam file issues a SAMPLE_PRELOAD instruction to capture the up-counter output pins' data, which is the up-counter data. Once the counter data is captured, the method proceeds to operation 236 where the Jam file issues the ISP_ENABLE_CLAMP instruction. This instruction causes the counter output pins to clamp to the sampled values. The method then advances to operation 238 where the Jam file issues the ISP_DISABLE instruction. As a result, the SRAM download starts to replace the existing design configuration with a new design configuration. In addition, all registers are cleared while the counter output pins are clamped to the sampled values. The method then proceeds to operation 240 where the logic core becomes operational and the input pins are released to capture the values from the clamped output pins. Here, the real-time ISP detection circuitry communicates with the counter to reload registers with the captured data from the clamped output pins. The method then advances to operation 242 where the Jam file forces the TAP controller state machine to reset state. Consequently, the device releases all output pins and the counter resumes operation so that the update was performed in a seamless manner and the register data is maintained.

Figure 7:
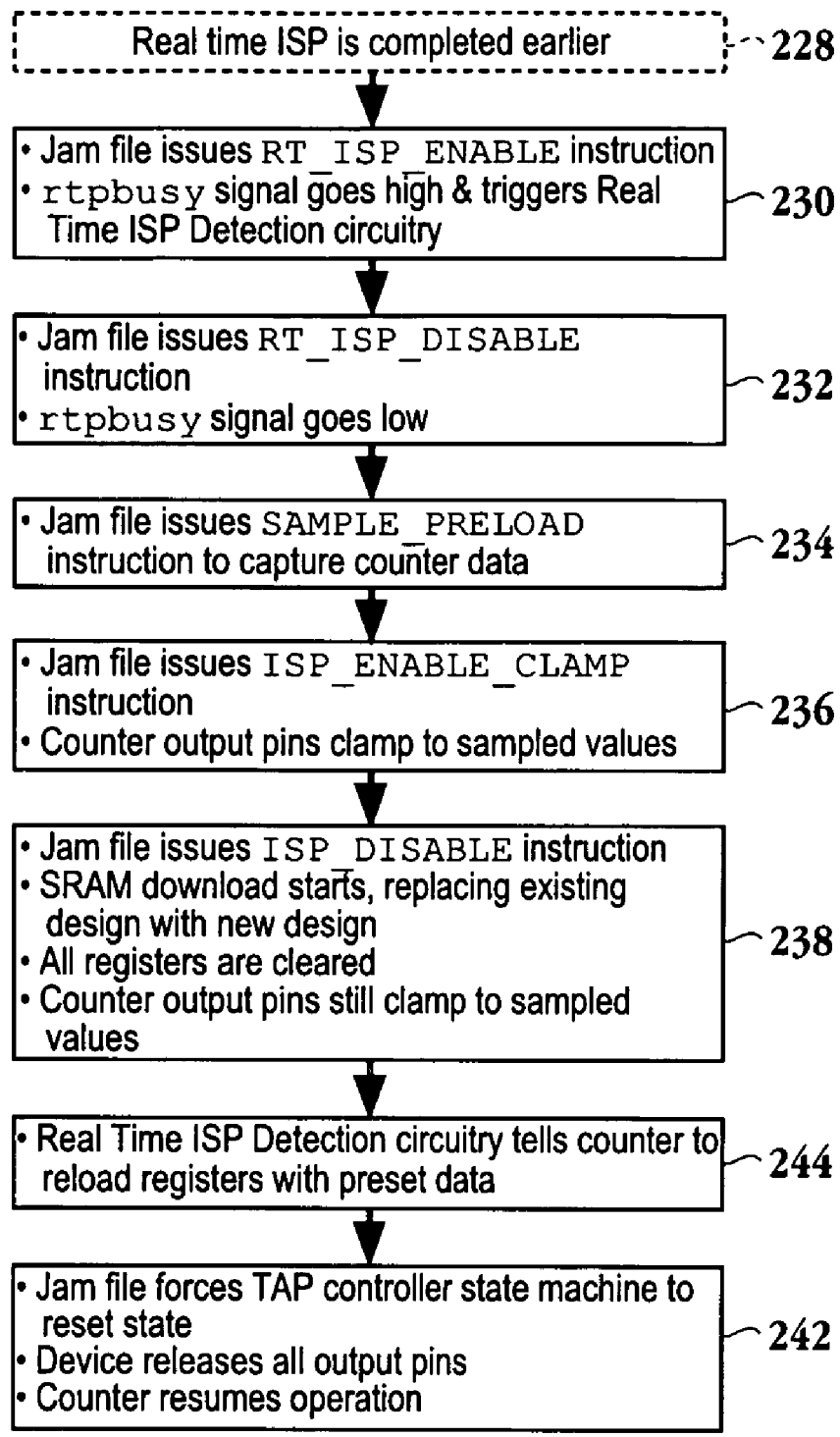
FIG. 7 is a flow chart diagram illustrating the use of pre-set data in order to perform the seamless update for the embodiment of FIG. 4 in accordance with one embodiment of the invention.

FIG. 7 is a flow chart diagram illustrating the use of pre-set data in order to perform the seamless update for the embodiment of FIG. 4 in accordance with one embodiment of the invention. It should be appreciated that with regard to FIG. 7, the output pins are clamped to the register values if registers are driving those pins. Operations 228 through 238 proceed as described above with regard to FIG. 6. In operation 244, the real-time ISP detection circuitry directs the up-counter to reload registers with the preset data. The data from this preset data is specified in the counter module since the configuration is known. The method then advances to operation 242 and proceeds as described above with regard to FIG. 6.

In summary, the above-described invention provides a method and apparatus that enables real-time in-system programmability without incurring any downtime or causing system unavailability, as well as maintaining register values that may be cleared due to the ISP methodology. The above described examples provide a solution that allows forcing the SRAM download after real-time ISP without the need for a power cycle. This design also provides a solution that allows the retention of the data of the registers in the device after going through the SRAM download process, either by using the UFM or input pins to retain the data. Together with the ISP Clamp feature, the above described embodiments describe a glitch-free SRAM download process. In one embodiment, the register data is reloaded through one of the three techniques discussed above with reference to FIGS. 2-4, after the registers have been cleared. That is, if the up counters are cleared and the control signal from the real-time ISP detection block is high, the registers are reloaded from the UFM, clamped output pins, or preset data. Thus, it should be noted here that the registers are cleared as indicated in operations 214 and 238 of FIGS. 4, 5, and 7, respectively. Furthermore, the rtpbusy signal transitions, i.e., goes high to trigger the real-time ISP detection block. The reload control captures the control signal from the real-time ISP detection block and once the registers are cleared, both conditions for reloading the registers from the UFM, clamped output pins, or preset data have been met. If the rtpbusy signal has not transitioned, then this does not trigger the real-time ISP detection block and if the registers are cleared, the registers are reset to all zeros as this is indicative of a power reset.

The embodiments, thus far, were described with respect to PLDs. The method and apparatus for in-system programmability, described herein may be incorporated into any suitable integrated circuit. For example, the method and apparatus may be incorporated into other types of programmable logic devices such as a programmable array logic (PAL), programmable logic array (PLA), field programmable logic array (FPLA), electrically programmable logic devices (EPLD), electrically erasable programmable logic device (EEPLD), logic cell array (LCA), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be the MAX® II devices owned by the assignee.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. An integrated circuit (IC) having in-system programmability (ISP) capability for updating a logic block of the IC, comprising:
    a first memory region for receiving an in-system update to a configuration of the IC;
    a second memory region for storing user non-configuration data; and
    a core logic region in communication with the first memory region, the core logic region including,
        interface logic for communicating with the first memory region;
        an ISP detection block in communication with the interface logic; and
        a controller in communication with the interface logic and the logic block,
    wherein when the first memory region receives the in-system update, a trigger signal is transitioned to cause the controller to read data within the logic block and store the read data into the second memory region and wherein the update to the configuration is transmitted into the core logic region and upon completion of the transmission, the ISP detection block triggers the logic block to reload register data from the second memory region through the controller when the device's registers have been cleared.

2. The IC of claim 1, wherein the ISP detection block triggers the logic block to reload by transmitting a signal external to the PLD that results in a reload signal being transmitted to the logic block from a source external to the PLD.

3. The IC of claim 1, wherein once the controller reads the data within the logic block, output pins of the PLD are locked with the execution on an ISP instruction.

4. The IC of claim 1, wherein while the update to the configuration is transmitted to the core logic region, the PLD I/O pins are clamped.

5. The IC of claim 4, wherein the PLD functions according to the update to the configuration without requiring a power cycle of the PLD or the logic block.

6. A method for in-system programmability (ISP) of an integrated circuit (IC), comprising method operations of:
    transitioning a trigger signal indicating initiation of a real-time ISP mode;
    capturing a current state of Input/Output pins for a logic block of the IC impacted by the ISP;
    storing data representing the current state;
    initiating a download of an updated configuration for the IC from a memory region;
    reloading the current state for the logic block from the stored data; and
    resuming operation of the IC and the logic block under the updated configuration without requiring a power reset of the IC.

7. The method of claim 6, wherein the method operation of transitioning a trigger signal indicating initiation of ISP mode includes,
    forcing the IC into a real-time ISP mode from a user mode;
    transitioning the trigger signal; and
    returning the IC to user mode from ISP mode.

8. The method of claim 6, wherein the method operation of capturing a current state of Input/Output pins for a logic block of the IC impacted by the ISP includes,
    clamping output pins to their respective states.

9. The method of claim 6, wherein the method operation of initiating a download of an updated configuration for the IC from the memory region occurs in response to a signal forcing the IC to enter and then exit an ISP mode, and wherein the initiating of the download causes the registers to be cleared.

10. The method of claim 6, wherein the method operation of storing data representing the current state is achieved by one of copying data representing the current state or locking output pins to their respective states.

11. The method of claim 8, wherein the method operation of reloading the current state for the logic block from the stored data includes,
    capturing data from the clamped output pins by the input pins of the logic device.

12. The method of claim 6, wherein the data representing the current state is pre-set in the design, in the logic core.

13. The method of claim 6 wherein each of the method operations are embodied as program instructions on a computer readable medium.

14. An integrated circuit (IC) capable of being updated without requiring a power reset, comprising:
    a memory region for receiving an in-system update to a configuration of the IC; and
    a core logic region in communication with the memory region, the core logic region including, interface logic for communicating with the memory region;

a logic block; and an in-system programming (ISP) detection block in communication with the interface logic, the ISP detection block receiving a trigger signal indicating initiation of a real-time in-system update for the IC, with the ISP detection block issuing another trigger signal, and after receipt of the trigger signal from the ISP detection block, the logic block reloads the cleared registers upon completion of the real-time system update.

15. The IC of claim 14, wherein the logic block reloads corresponding registers from one of the memory region, output pins of the logic block, or an external memory region to the IC.

16. The IC of claim 14, wherein upon initiation of the real-time in-system update, a state of output pins of the logic block are locked.

17. The IC of claim 14, wherein the ISP detection block routes the trigger signal off-chip of the IC and an external source to the IC transmits the trigger signal to the logic block to reload in order to hold the trigger signal at a first transition state.

18. The IC of claim 14, wherein the memory region stores a captured state of registers of the logic device prior to updating the configuration.

19. The IC of claim 14, wherein the ISP detection block routes the trigger signal off-chip of the IC in order to hold the trigger signal at a first transition state and which causes a preset configuration to be loaded into the corresponding registers from a non volatile memory external to the IC, or from the logic core within the IC.

20. The IC of claim 14, wherein the memory region stores a current state of registers of the logic block in response to the initiation of the real-time in-system update for the IC.

* * * * *